US008823913B2

(12) United States Patent
Jin et al.

(10) Patent No.: US 8,823,913 B2
(45) Date of Patent: Sep. 2, 2014

(54) THIN FILM TRANSISTOR ARRAY PANEL AND METHOD FOR REPAIRING THE SAME

(71) Applicant: Samsung Display Co., Ltd., Yongin (KR)

(72) Inventors: Guang-Hai Jin, Yongin (KR); Dong-Gyu Kim, Yongin (KR); Kwan-Wook Jung, Yongin (KR); Moo-Jin Kim, Yongin (KR)

(73) Assignee: Samsung Display Co., Ltd., Giheung-Gu, Yongin, Gyeonggi-Do (KR)

( * ) Notice: Subject to any disclaimer, the term of this patent is extended or adjusted under 35 U.S.C. 154(b) by 0 days.

(21) Appl. No.: 13/828,994

(22) Filed: Mar. 14, 2013

(65) Prior Publication Data
US 2014/0110678 A1    Apr. 24, 2014

(30) Foreign Application Priority Data
Oct. 19, 2012    (KR) .......................... 10-2012-0116738

(51) Int. Cl.
G02F 1/1345    (2006.01)
G02F 1/00    (2006.01)
G02F 1/1343    (2006.01)

(52) U.S. Cl.
CPC ...... G02F 1/00 (2013.01); G02F 2001/134318 (2013.01)
USPC .................... 349/149; 349/42; 438/34; 438/4

(58) Field of Classification Search
CPC ............................... G02F 1/00; G02F 2001/00
USPC ................................. 349/149, 42; 438/34, 4
See application file for complete search history.

(56) References Cited

U.S. PATENT DOCUMENTS

| 4,259,367 | A | * | 3/1981 | Dougherty, Jr. ................... 438/4 |
| 4,752,118 | A | * | 6/1988 | Johnson .......................... 349/54 |
| 4,807,973 | A | * | 2/1989 | Kawasaki ..................... 349/192 |
| 5,086,347 | A | * | 2/1992 | Ukai et al. ...................... 349/55 |
| 5,303,074 | A | * | 4/1994 | Salisbury ........................ 349/55 |
| 5,475,246 | A | * | 12/1995 | Wei et al. ...................... 257/291 |
| 5,532,853 | A | * | 7/1996 | Song et al. .................... 349/149 |
| 5,648,826 | A | * | 7/1997 | Song et al. ...................... 349/42 |

(Continued)

FOREIGN PATENT DOCUMENTS

| KR | 10-2007-0066264 |  | 6/2007 |  |
| KR | 10 20070066264 | * | 6/2007 | ............. G02F 1/136 |
| KR | 10-2009-0040658 |  | 4/2009 |  |
| KR | 10 20090040658 | * | 4/2009 | ............. H05B 33/06 |

Primary Examiner — Telly Green
(74) Attorney, Agent, or Firm — Robert E. Bushnell, Esq.

(57) ABSTRACT

A thin film transistor substrate includes a substrate including a display area including: pixels and a periphery area where a driver for driving the pixels is disposed; first signal lines connected with the pixels and extended to the periphery area, and including first short-circuit portions provided in the periphery area; second signal lines connected with the pixels and extended to the periphery area by crossing the first signal lines in an insulated manner; first connection members overlapping lateral ends of the first signal lines, disposed in lateral sides with respect to the first short-circuited portions, and formed of a doped semiconductor; and first repairing conductors overlapping the lateral ends of the first signal lines, and disposed in the lateral sides with respect to the first short-circuited portions. Lateral ends of the first connection members are connected with the lateral ends of the first signal lines through contact holes.

9 Claims, 12 Drawing Sheets

(56) References Cited

U.S. PATENT DOCUMENTS

| | | | |
|---|---|---|---|
| 5,684,547 A * | 11/1997 | Park et al. | 349/54 |
| 6,313,889 B1 * | 11/2001 | Song et al. | 349/54 |
| 7,209,193 B2 * | 4/2007 | Song et al. | 349/54 |
| 7,405,427 B2 * | 7/2008 | Lee et al. | 257/59 |
| 7,507,592 B2 * | 3/2009 | Lee et al. | 438/25 |
| 7,538,848 B2 * | 5/2009 | Park et al. | 349/152 |
| 7,683,860 B2 * | 3/2010 | Nagao et al. | 345/76 |
| 8,031,317 B2 * | 10/2011 | Park et al. | 349/152 |
| 8,179,494 B2 * | 5/2012 | Chung et al. | 349/54 |
| 8,189,132 B2 * | 5/2012 | Chung et al. | 349/55 |
| 8,416,359 B2 * | 4/2013 | Choi et al. | 349/54 |
| 2006/0126004 A1 * | 6/2006 | Kim et al. | 349/192 |
| 2009/0295773 A1 * | 12/2009 | Taneda et al. | 345/211 |

\* cited by examiner

THIN FILM TRANSISTOR ARRAY PANEL AND METHOD FOR REPAIRING THE SAME

CLAIM OF PRIORITY

This application makes reference to, incorporates the same herein, and claims all benefits accruing under 35 U.S.C. §119 from an application earlier filed in the Korean Intellectual Property Office on 19 Oct. 2012 and there duly assigned Serial No. 10-2012-0116738.

BACKGROUND OF THE INVENTION

1. Field of the Invention

An embodiment of the present invention relates generally to a thin film transistor substrate and a method for repairing the same. More particularly, an embodiment of the present invention relates generally to a method for repairing damage due to static electricity.

2. Description of the Related Art

In general, a thin film transistor (TFT) array panel is used as a circuit board for independently driving each pixel in a liquid crystal display device, an organic electroluminescence (EL) display device, or the like. The thin film transistor substrate is formed of a scan signal wire transmitting a scan signal or a gate wire, an image signal wire transmitting an image signal or a data wire, a thin film transistor connected with the gate wire and the data wire, a first electrode connected with the thin film transistor, a gate insulating layer insulating the gate wire by covering the same, and an interlayer insulating layer insulating the thin film transistor and the data wire by covering the same.

The thin film transistor is formed of a gate electrode that is a part of the gate wire, a semiconductor forming a channel, a source electrode and a drain electrode that are a portion of the data wire, a gate insulating layer, and an interlayer insulating layer. The thin film transistor is a switching element transmitting an image signal transmitted through the data wire according to the scan signal, transmitted through the gate wire, to a first electrode or interrupting the transmission of the image signal.

The thin film transistor substrate is controlled by a driving integrated circuit (IC) connected with the gate wire and the data wire, and a signal applied to the driving IC is connected using a flexible printed circuit (FPC) film after forming a circuit in an additional printed circuit board (PCB).

Meanwhile, static electricity generated during a manufacturing process of the thin film transistor substrate flows into a weak portion of a display panel and locally exists therein. The inflow static electricity causes increase of a voltage in the portion where the static electricity exists even through the amount of static electricity is insignificant so that an element like a thin film transistor may be damaged or a wire may be short-circuited.

Such a failure causes the corresponding pixel to be defective; therefore, a repairing process should be performed.

The above information disclosed in this Background section is only for enhancement of understanding of the background of the described technology and therefore it may contain information that does not form the prior art that is already known in this country to a person of ordinary skill in the art.

SUMMARY OF THE INVENTION

An embodiment of the present invention has been made in an effort to provide a thin film transistor substrate that may minimize damage to a wire and an element due to static electricity flowing into a display device, and a method for repairing the same.

In addition, an embodiment of the present invention provides a thin film transistor and a repairing method thereof for convenient repairing of a pixel defective due to static electricity.

A thin film transistor substrate constructed with the principle of an embodiment of the present invention includes a substrate including a display area including a plurality of pixels and a periphery area where a driver for driving the pixels is disposed; a plurality of first signal lines connected with the pixels and extended to the periphery area, and each including a first short-circuit portion provided in the periphery area; a plurality of second signal lines connected with the pixels and extended to the periphery area by crossing the first signal lines in an insulated manner; first connection members overlapping lateral ends of the first signal lines, disposed in lateral sides with respect to the first short-circuited portion and formed of a semiconductor doped with a conductive impurity; and first repairing conductors overlapping the lateral ends of the first signal lines, disposed in the lateral sides with respect to the first short-circuited portion. Lateral ends of the first connection members are connected with the lateral ends of the first signal lines through contact holes.

At least one of the first connection members may include a short-circuited portion.

At least one of the first repairing conductors may be short-circuited with the lateral ends of the first signal line.

The second signal line may include a second short-circuited portion disposed in the periphery area. The thin film transistor substrate includes second connection members overlapping lateral ends of the second signal lines, disposed in lateral sides with respect to the second short-circuited portion and formed of a semiconductor doped with a conductive impurity; and second repairing conductors overlapping the lateral ends of the second signal line, disposed in the lateral sides with respect to the second short-circuited portion. Lateral ends of the second connection members are connected with the lateral ends of the second signal lines through contact holes.

At least one of the second connection members may include a short-circuited portion.

At least one of the second repairing conductors may be short-circuited with the lateral ends of the second signal line.

The first signal line may be applied with a data signal and the second signal line may be applied with a gate signal.

A method for repairing the thin film transistor substrate includes short-circuiting the repairing conductor and the first signal line by irradiating laser to lateral ends of the first signal line, overlapping lateral ends of the repairing conductor.

An OLED display device constructed with the principle of an embodiment of the present invention includes a substrate; a plurality of first signal lines disposed on the substrate and including first short-circuited portions; a plurality of second signal lines crossing the first signal lines in an insulated manner; a thin film transistor connected with the first signal line and the second signal line; an organic light emitting element connected with the thin film transistor; first connection members overlapping lateral ends of the first signal line, disposed in lateral sides with respect to the first short-circuited portion and formed of semiconductors doped with a conductive impurity; and first repairing conductors overlapping the lateral ends of the first signal line, disposed in the lateral sides with respect to the first short-circuited portion.

Lateral ends of the first connection member are connected with the lateral ends of the first signal line through contact holes.

At least one of the first connection members may include a short-circuited portion.

At least one of the first repairing conductors may be short-circuited with the lateral ends of the first signal line.

The second signal line includes a second short-circuited portion disposed in the periphery area. The OLED display device includes second connection members overlapping lateral ends of the second signal line, disposed in lateral sides with respect to the second short-circuited portion and formed of a semiconductor doped with a conductive impurity; and second repairing conductors overlapping the lateral ends of the second signal line, disposed in the lateral sides with respect to the second short-circuited portion. Lateral ends of the second connection member are connected with the lateral ends of the second signal line through contact holes.

The substrate may include a display area where the pixels are disposed and a periphery area where a driver for driving the pixels is disposed, and the first short-circuited portion and the second short-circuited portion may be disposed in the periphery area.

At least one of the second connection members may include a short-circuited portion.

At least one of the second repairing conductors may be short-circuited with the lateral ends of the second signal line.

The first signal line may be applied with a data signal and the second signal line may be applied with a gate signal.

In accordance with the principle of the present invention, externally transmitted static electricity may be blocked by a connection member by forming a repairing portion, and therefore damage to a pixel due to the static electricity may be prevented.

In addition, although a wire is damaged due to the static electricity, the damaged wire may be easily repaired, thereby preventing generation of a defective pixel.

Accordingly, the defective rate of the thin film transistor substrate may be minimized.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings in which like reference symbols indicate the same or similar components, wherein.

DETAILED DESCRIPTION OF THE INVENTION

Figure 1:
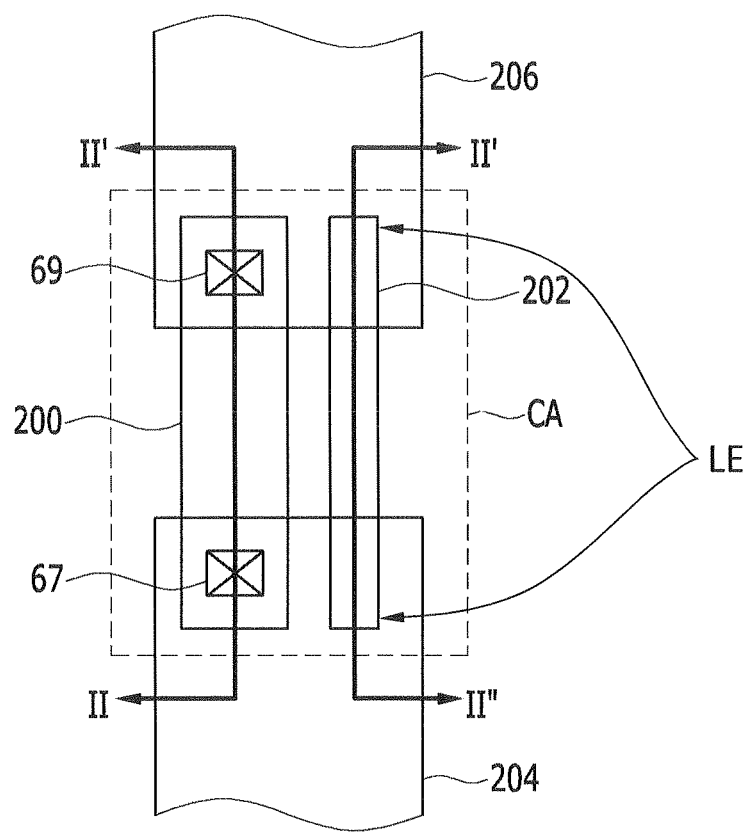
FIG. 1 is a top plan view of a repairing portion according to an embodiment of the present invention.

The present invention will be described more fully hereinafter with reference to the accompanying drawings, in which exemplary embodiments of the invention are shown. As those skilled in the art would realize, the described embodiments may be modified in various different ways, all without departing from the spirit or scope of the present invention.

The drawings and description are to be regarded as illustrative in nature and not restrictive. Like reference numerals designate like elements throughout the specification.

In addition, the size and thickness of each component shown in the drawings are arbitrarily shown for understanding and ease of description, but the present invention is not limited thereto.

In the drawings, the thickness of layers, films, panels, regions, etc., are exaggerated for clarity. In the drawings, for understanding and ease of description, the thickness of some layers and areas is exaggerated. It will be understood that when an element such as a layer, film, region, or substrate is referred to as being "on" another element, it can be directly on the other element or intervening elements may also be present.

In addition, unless explicitly described to the contrary, the word "comprise" and variations such as "comprises" or "comprising", will be understood to imply the inclusion of stated elements but not the exclusion of any other elements. It will be understood that, when an element such as a layer, film, region, or substrate is referred to as being "on" another element, it can be directly on the other element or intervening elements may also be present.

Hereinafter, a repairing portion according to an embodiment of the present invention will be described with reference to the drawings.

Figure 2:
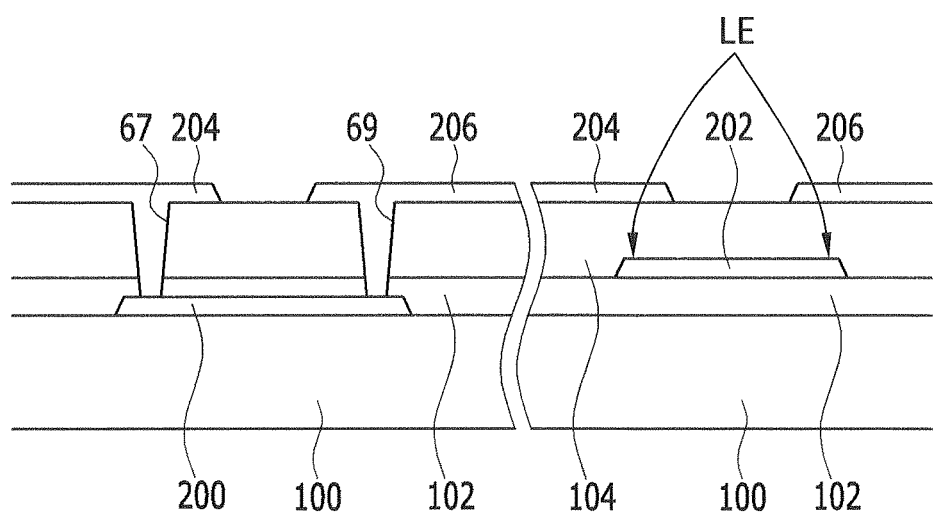
FIG. 2 is a cross-sectional view of FIG. 1, taken along the lines II-II' and II'-II".

FIG. 1 is a top plan view of a repairing portion according to an embodiment and FIG. 2 is a cross-sectional view of FIG. 1, taken along the lines II-II' and II'-II".

As shown in FIG. 1 and FIG. 2, a repairing portion CA according to an embodiment includes a substrate 100, a connection member 200 disposed on the substrate 100, a first insulation layer 102 disposed on the connection member 200, a repairing conductor 202 disposed on the first insulation layer 102, a second insulation layer 104 disposed on the repairing conductor 202, and first and second conductors 204 and 206 disposed on the second insulation layer 104.

In further detail, the substrate 100 may be an insulation substrate made of transparent glass or plastic.

The connection member 200 may be formed of a semiconductor material like polysilicon, microcrystalline silicon, or amorphous silicon, and is doped with a conductive impurity with high concentration. The doped impurity may be one of a p-type impurity and an n-type impurity.

The first insulation layer 102 and the second insulation layer 104 may be formed by a single layer or a plurality of layers of an inorganic insulator such as silicon nitride (SiNx) or silicon oxide (SiOx), an organic insulator, a low dielectric insulator, and the like.

The repairing conductor 202, the first conductor 204, and the second conductor 206 are conducting materials, and may be made of an aluminum-based metal such as aluminum (Al) or an aluminum alloy, a silver-based metal such as silver (Ag) or a silver alloy, a copper-based metal such as copper (Cu) or a copper alloy, a molybdenum-based metal such as molybdenum (Mo) or a molybdenum alloy, chromium (Cr), tantalum (Ta), titanium (Ti), and the like. However, the repairing conductor 202, the first conductor 204, and the second conductor 206 may have a multilayered structure including at least two conductive layers having different physical properties.

The first conductor 204 and the second conductor 206 are electrically connected with the connection member 200 through contact holes 67 and 69 formed in the first insulation layer 102 and the second insulation layer 104. The repairing conductor 202 is insulated from the first conductor 204 and the second conductor 206 by the second insulation layer 104. In addition, lateral ends LE of the repairing conductor 202 respectively overlap the first conductor 204 and the second conductor 206.

A repairing method in case of inflow of static electricity using the repairing portion will be described in further detail with reference to FIG. 3 and FIG. 4.

Figure 3:
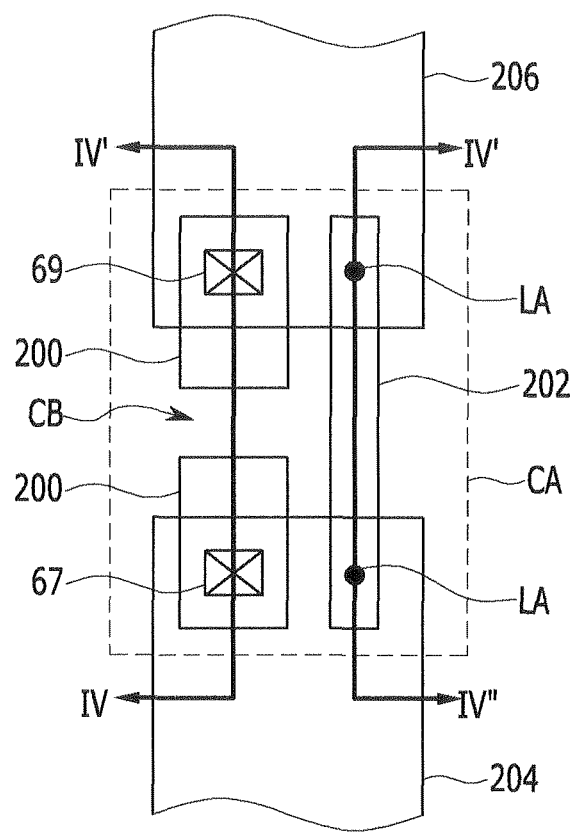
FIG. 3 is a top plan view of the repairing portion after inflow of static electricity according to the embodiment of the present invention.
Figure 4:
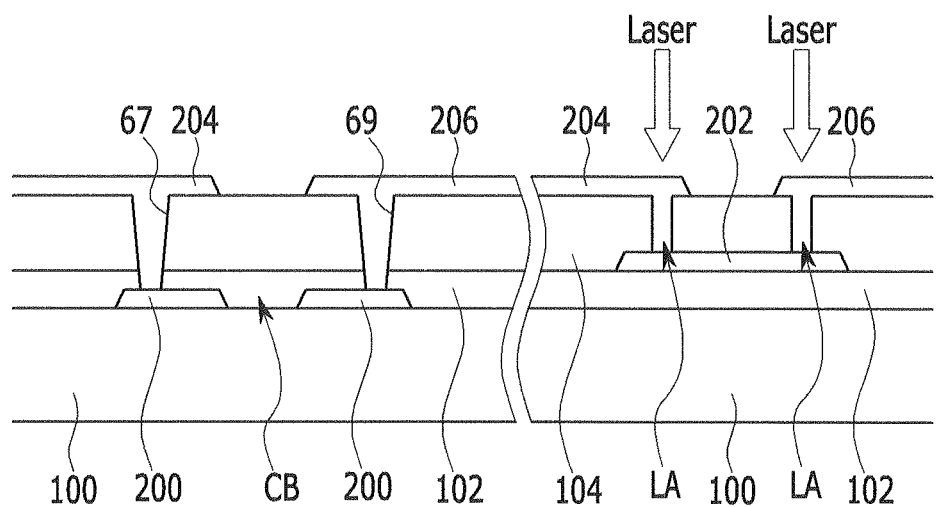
FIG. 4 is a cross-sectional view of FIG. 3, taken along the lines IV-IV' and IV'-IV".

FIG. 3 is a top plan view of the repairing portion after inflow of static electricity according to the embodiment and FIG. 4 is a cross-sectional view of FIG. 3, taken along the lines IV'-IV and IV'-IV".

As shown in FIG. 3 and FIG. 4, when static electricity is applied to the repairing portion CA, a high voltage is instantaneously applied thereto so that the connection member 200 is damaged due to the high voltage, thereby causing short-circuit CB to become open-circuit.

Thus, a signal input to the first conductor 204 cannot be transmitted through the second conductor 206 to a pixel connected with the second conductor 206 so that the pixel becomes a defective pixel.

In order to repair such a defective pixel, lasers are irradiated to lateral ends of the first conductor 204 and the second conductor 206, respectively, that overlap the repairing conductor 202 to short-circuit LA the first and second conductors 204 and 206 by the repairing conductor 202.

Since the lateral ends of the repairing conductor 202 overlap the first conductor 204 and the second conductor 206, the first conductor 204 and the second conductor 206 are short-circuited by laser irradiation and then electrically connected with each other.

After that, a signal applied to the first conductor 204 is transmitted to the pixel after passing through the second conductor 206 not through the short-circuited connection member but through the repairing conductor 202.

The repairing portion may be formed in a thin film transistor substrate of a display panel like a liquid crystal display device (LCD), and organic light emitting diode (OLED) display device, and the like.

Hereinafter, a thin film transistor substrate including the repairing portion of FIG. 1 and FIG. 2 will be described.

Figure 5:
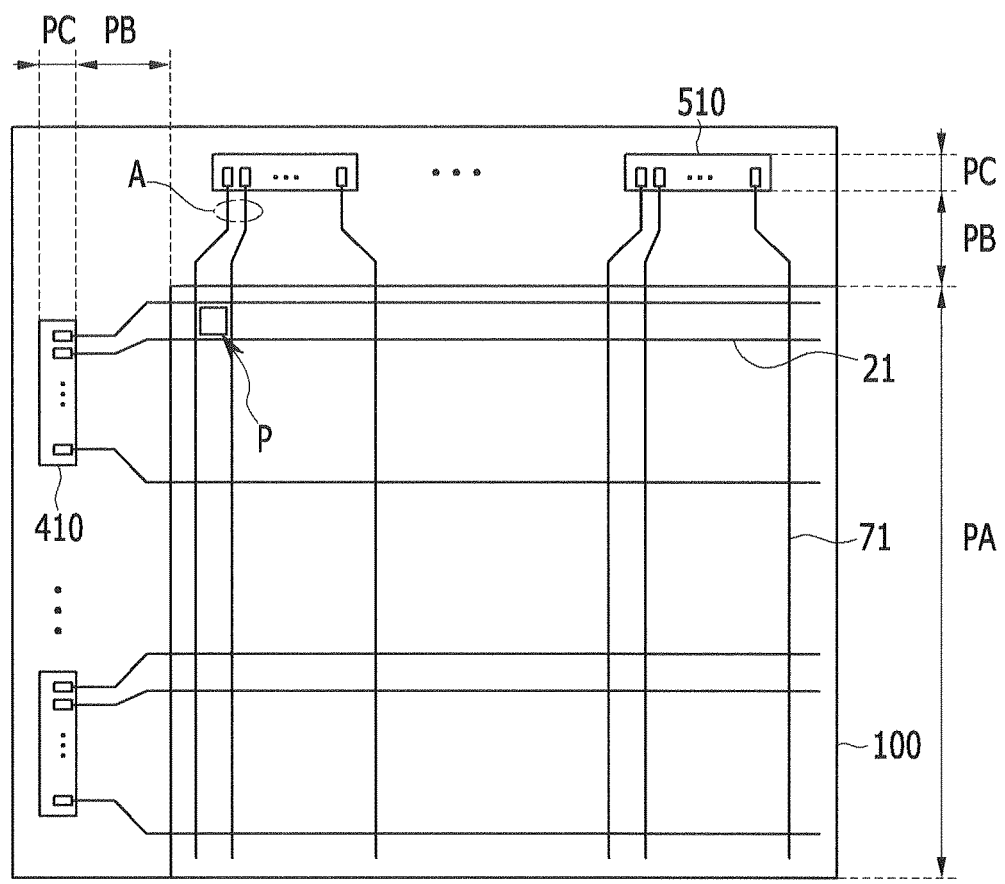
FIG. 5 is a schematic layout view of a thin film transistor substrate according to an embodiment of the present invention.
Figure 6:
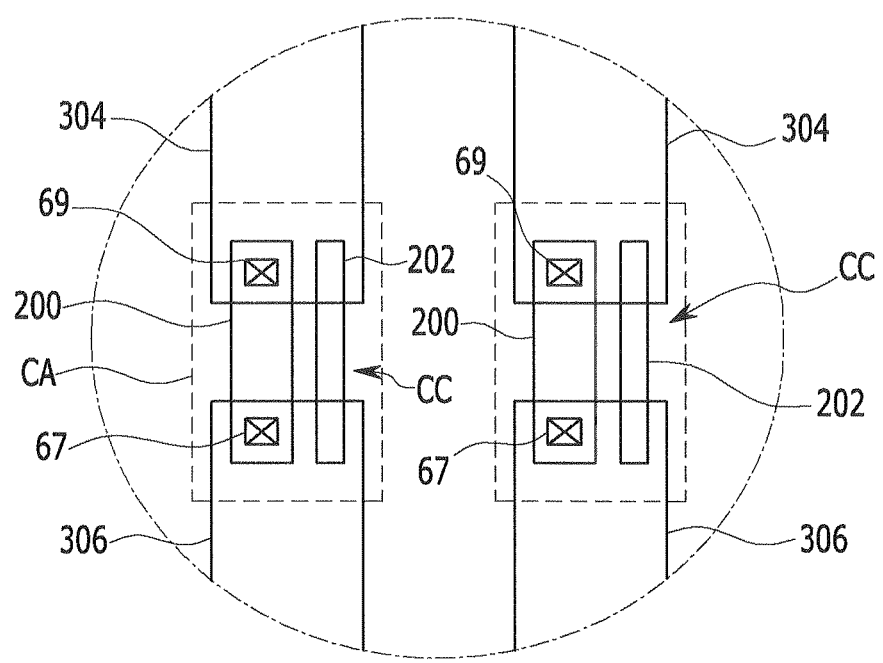
FIG. 6 is an enlarged layout view of "A" in FIG. 5.

FIG. 5 is a schematic layout view of a thin film transistor substrate according to the embodiment and FIG. 6 is an enlarged layout view of "A" in FIG. 5.

As shown in FIG. 5, the thin film transistor substrate according to the embodiment includes a display area PA, a driver PC, and an extended portion PB for connecting the driver PC and the display area PA. The display area PA, the driver PC, and the extended portion PB are formed on an insulation substrate 100. An area of the display area PA, in which the driver PC and the extended portion PB are formed, is referred to as a peripheral area.

The display area PA includes a first signal line 21 extended in one direction and transmitting a scan signal, a second signal line 71 crossing the first signal line 21 and transmitting an image signal, and pixels P connected with the first and second signal lines 21 and 71, respectively, to display an image and arranged in a matrix format.

The driver PC includes a first driving circuit 410 and a second driving circuit 510 connected with the first signal line 21 or the second signal line 71 to transmit an external signal. The first driving circuit 410 and the second driving circuit 510 may be mounted on the substrate 100 as an IC chip, or may be integrated on the substrate 100, together with the thin film transistor.

The extended portion PB is a portion of the first signal line 21 or the second signal line 71 and is disposed in the periphery area of the display area PA, and connects the driving circuits 410 and 510 and the first and second signal lines 21 and 71, respectively, of the display area PA.

The extended portion PB includes the repairing portion of FIG. 1 and FIG. 2.

As shown in FIG. 6, the second signal line 71 includes a short-circuited portion CC, and includes a first small signal line 304 and a second small signal line 306 disposed at both ends with respect to the short-circuited portion CC. The first small signal line 304 and the second small signal line 306 may be first conductor 204 and the second conductor 206 of the repairing portion CA, shown in FIG. 1, respectively.

The connection member 200 and the repairing conductor 202 are separately formed in parallel with each other in the short-circuited portion CC between the first small signal line 304 and the second small signal line 306.

The connection member 200 is electrically connected with the first small signal line 304 and the second small signal line 306 through the contact holes 67 an 69, and lateral ends of the repairing conductor 202 respectively overlap one end of the first small signal line 304 and the second small signal line 306, respectively.

An organic light emitting diode (OLED) display device including the thin film transistor substrate will be described in further detail with reference to FIG. 7 to FIG. 9.

Figure 7:
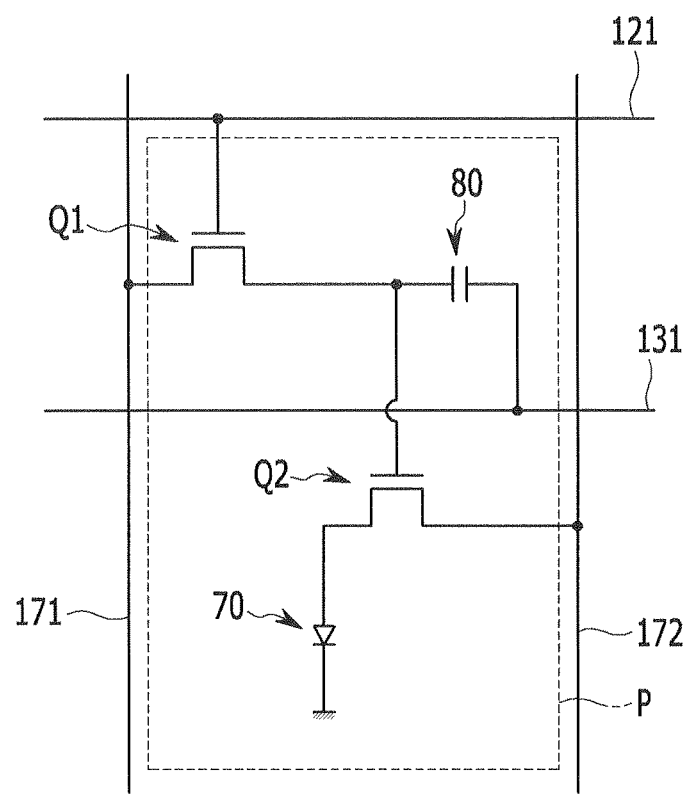
FIG. 7 is an equivalent circuit diagram of an organic light emitting diode (OELD) display device according to a pixel of the present invention.

FIG. 7 is an equivalent circuit diagram of an OLED display device according to the pixel of the present invention.

As shown in FIG. 7, one pixel P has a 2Tr-1Cap structure including the organic light emitting element 70, first and second thin film transistors (TFTs) Q1 and Q2, respectively, and one capacitor 80. However, the embodiment is not limited to that structure. Thus, in an OLED display device 1001, the pixel P may include three or more thin film transistors and two or more capacitors, and may have a variety of structures further including an additional wire thereto. The thin film transistors and capacitors additionally formed may be the elements of a compensation circuit.

The compensation circuit suppresses deviation from occurring in image quality by improving the uniformity of the organic light emitting diode 70 formed in each pixel P. In general, the compensation circuit includes two to eight thin film transistors.

The organic light emitting element 70 includes an anode electrode, that is, a hole injection electrode, a cathode electrode, that is, an electron injection electrode, and an organic emission layer disposed between the anode electrode and the cathode electrode.

In the embodiment, one pixel P includes a first thin film transistor Q1 and a second thin film transistor Q2.

The first thin film transistor Q1 and the second thin film transistor Q2 respectively include gate electrodes, semiconductors, source electrodes, and drain electrodes. In addition, a semiconductor of at least one of the first thin film transistor Q1 and the second thin film transistor Q2 includes an amorphous silicon layer and a polysilicon layer doped with microcrystalline silicon or an impurity.

FIG. 7 illustrates a gate line 121, a data line 171, a constant voltage line 172, and a capacitor line 131, but the capacitor line 131 may be omitted as necessary. The gate line 121 and data line 171 may be the first signal line 102 and the second signal line 104 of FIG. 5, respectively.

The data line 171 is connected with a source electrode of the first thin film transistor Q1, and the gate line 121 is connected with a gate electrode of the first thin film transistor Q1. In addition, a drain electrode of the first thin film transistor Q1 is connected to the capacitor line 131 through the capacitor 80. A node is formed between the drain electrode of the first thin film transistor Q1 and the capacitor 80 so that a gate electrode of the second thin film transistor Q2 is connected thereto. In addition, a source electrode of the second thin film transistor Q2 is connected with a constant voltage line 172 and a drain electrode thereof is connected with an anode of the organic light emitting element 70.

The first thin film transistor Q1 is used as a switch to select a pixel P for light emission. When the first thin film transistor Q1 is instantaneously turned on, the capacitor 80 is charged and the amount of charge charged at this point is proportional to a potential of a voltage applied from the data line 171. In addition, when a voltage increasing signal is inputted for each frame cycle to the capacitor line 131 in the turn-off state of the first thin film transistor Q1, a gate potential of the second thin film transistor Q2 is increased along a voltage applied through the capacitor line 131. Here, the voltage has a level of a voltage applied with reference to the potential charged in the capacitor 80. The second thin film transistor Q2 is turned on when the gate potential exceeds a threshold voltage. Then, a voltage applied to the constant voltage line 172 is applied to the organic light emitting element 70 through the second thin film transistor Q2 so that the organic light emitting element 70 emits light.

Figure 8:
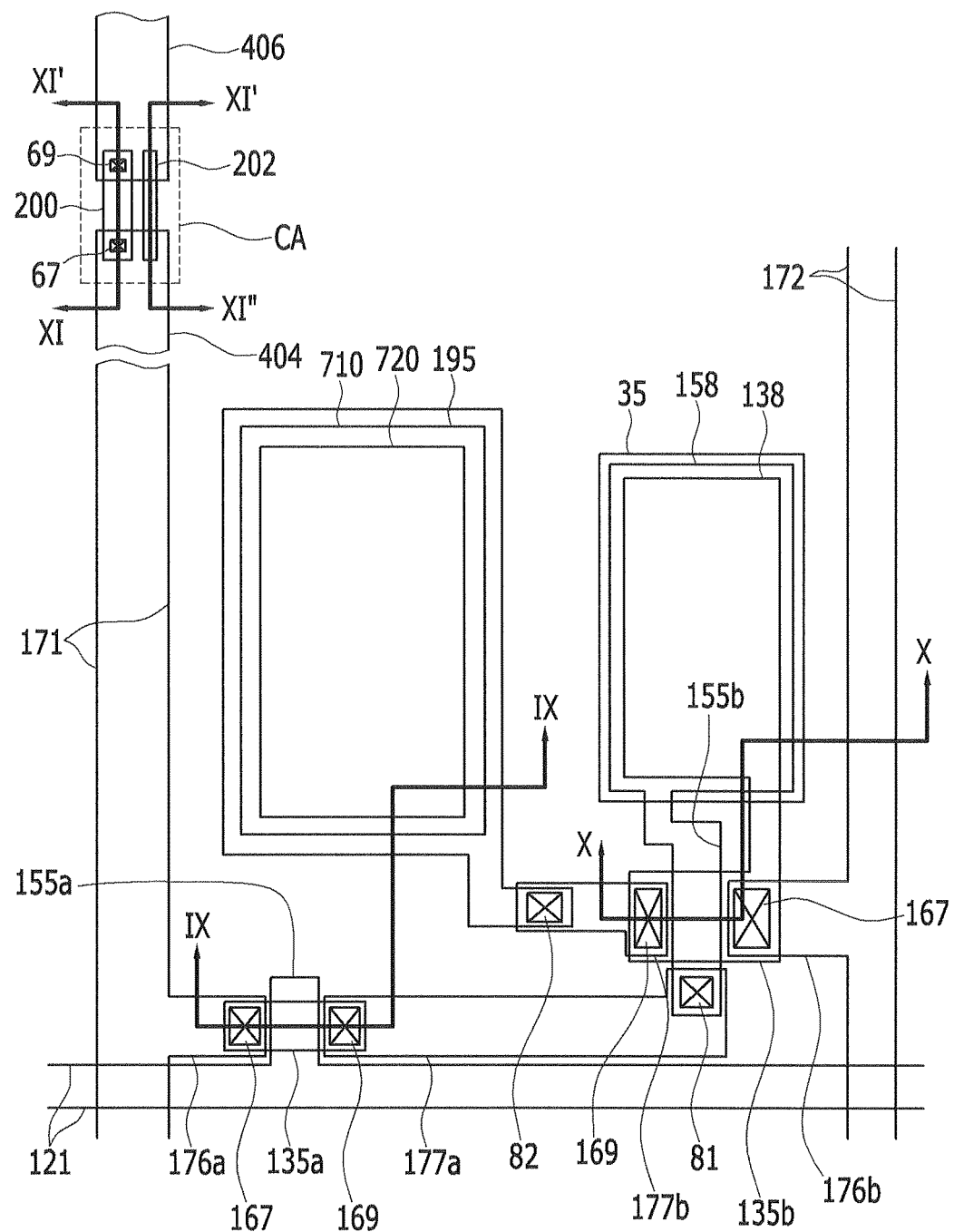
FIG. 8 is a top plan view of the OLED display device according to the exemplary embodiment.
Figure 9:
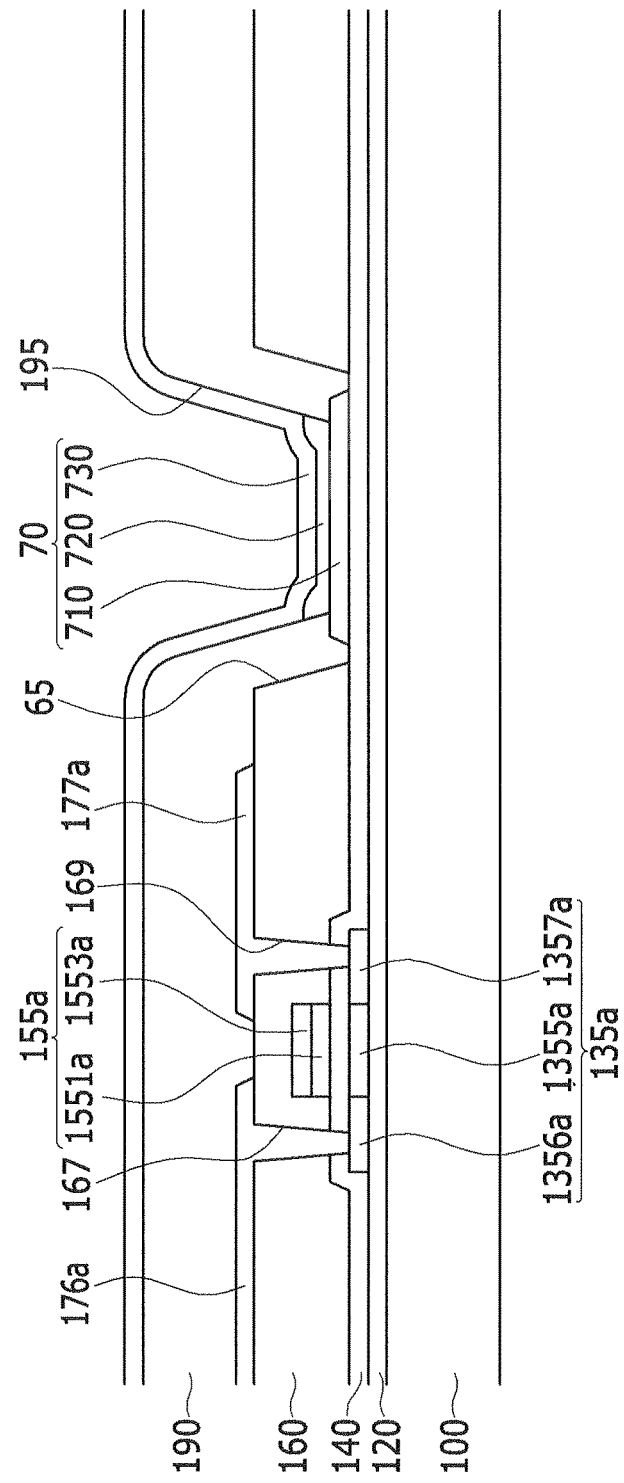
FIG. 9 is a cross-sectional view of FIG. 8, taken along the line IX-IX.
Figure 10:
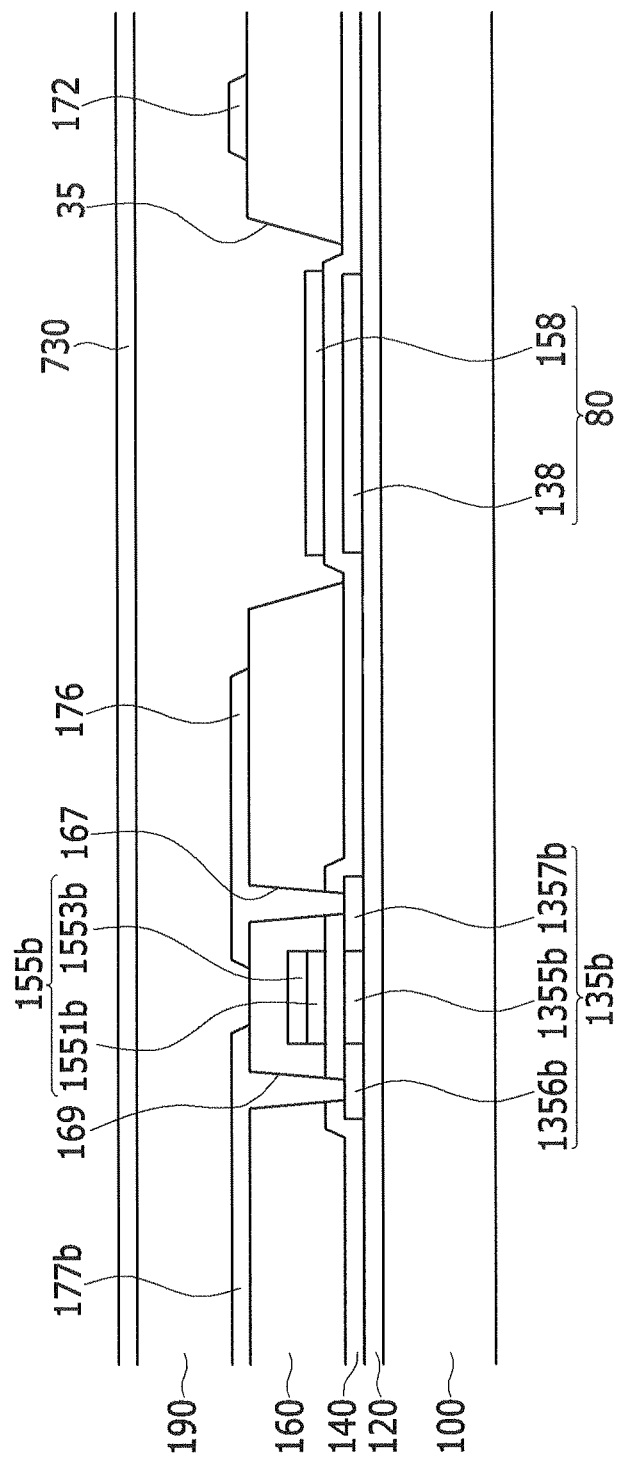
FIG. 10 is a cross-sectional view of FIG. 8, taken along the line X-X.
Figure 11:
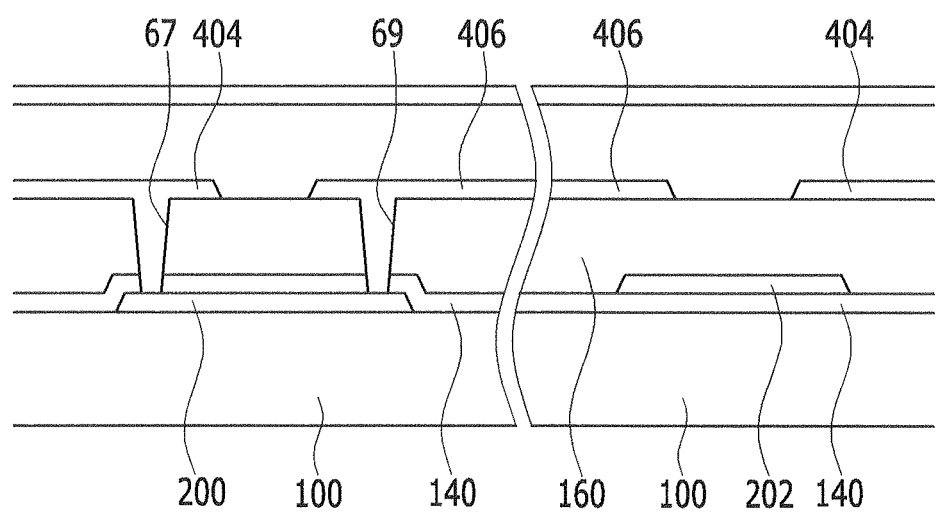
FIG. 11 is a cross-sectional view of FIG. 8, taken along the lines XI'-XI and XI'-XI".

FIG. 8 is a top plan view of the OLED display device according to the embodiment, FIG. 9 is a cross-sectional view of FIG. 8, taken along the line IX-IX, FIG. 10 is a cross-sectional view of FIG. 8, taken along the line X-X, and FIG. 11 is a cross-sectional view of FIG. 8, taken along the lines XI-XI' and XI'-XI".

Referring to FIG. 8 to FIG. 11 and FIG. 2, a buffer layer 120 is formed on the substrate 100.

The substrate 100 may be an insulating material formed of glass, quartz, ceramic, or plastic, or the substrate 100 may be a metallic substrate formed of stainless steel.

The buffering layer 120 may have a single-layered structure of silicon nitride (SiNx), or a double-layered structure of silicon nitride (SiNx) and silicon oxide (SiO2). The buffering layer 120 has a role of preventing unneeded components like impure elements or moisture from intruding into the target, while flattening the surface thereof at the same time.

A first semiconductor 135a and a second semiconductor 135b formed of polysilicon, a first capacitor electrode 138, and the connection member 200 are formed on the buffer layer 120.

The first semiconductor 135a and the second semiconductor 135b are divided into channel areas 1355a and 1355b, source areas 1356a and 1356b and drain areas 1357a and 1357b, respectively, formed on both sides of the channel areas 1355a and 1355b. The channel areas 1355a and 1355b of the first semiconductor 135a and the second semiconductor 135b are polysilicon into which impurities have not been doped, that is, intrinsic semiconductors. The source areas 1356a and 1356b and the drain areas 1357a and 1357b of the first semiconductor 135a and the second semiconductor 135b are polysilicon into which conductive impurities have been doped, that is, impurity semiconductors.

The first capacitor electrode 138 and the connection member 200 are doped with conductive impurities that are the same as the conductive impurities of the source areas 1356a and 1356b and the drain areas 1357a and 1357b.

The impurities doped into the source areas 1356a and 1356b, the drain areas 1357a and 1357b, and the first capacitor electrode 138 may be one of a P-type impurity and an n-type impurity.

A gate insulating layer 140 is formed on the first semiconductor 135a, the second semiconductor 135b, the first capacitor electrode 138, and the connection member 200. The gate insulating layer 140 may be the first insulation layer 102 of the repairing portion CA of FIGS. 1 and 2.

The gate insulating layer 140 may be a single layer or a plurality of layers including at least one of tetra ethyl ortho silicate (TEOS), silicon nitride (SiNx), and silicon oxide (SiO2).

The first electrode 710, the gate line 121, the second gate electrode 155b, the repairing conductor 202, and the second capacitor electrode 158 are formed on the gate insulating layer 140.

The gate line 121 extends lengthwise in a horizontal direction and transfers a gate signal. The gate line 121 includes a first gate electrode 155a that protrudes from the gate line 121 to the first semiconductor 135a.

The first gate electrode 155a and the second gate electrode 155b respectively overlap the channel area 1355a.

The first gate electrode 155a and the second gate electrode 155b are formed of lower metal layers 1551a and 1551b and upper metal layers 1553a and 1553b. The lower metal layers 1551a and 1551b may be formed of a transparent conductive material such as indium tin oxide (ITO), indium zinc oxide (IZO), zinc oxide (ZnO), and the like, and the upper metal layers 1553a and 1553b may be formed of a single layer of a multiple layer of tungsten, molybdenum, aluminum, or an alloy thereof.

The second capacitor electrode 158 is overlapped with the first capacitor electrode 138 and connected with the second gate electrode 155b. The second capacitor electrode 158 may be formed of the same material as the lower metal layer 1551a of the first gate electrode 155a.

The first capacitor electrode 138 and the second capacitor electrode 158 form the capacitor 80 using the gate insulating layer 140 as a dielectric material.

The first electrode 710 is formed of a transparent conductive material that is the same material as the lower metal layer 1551a of the first gate electrode 155a. The first pixel electrode 710 is connected with the drain electrode 177b of the second thin film transistor and thus becomes an anode of the organic light emitting element 70. The first pixel electrode 710 and the gate electrode 155a may be formed through the same process, and in this case, the first pixel electrode 710 may be located lower than the source electrode 176a or the drain electrode 177a.

The repairing conductor 202 is formed of the same material as the first gate electrode 155a and the second gate electrode 155b.

An interlayer insulating layer 160 is formed on the gate line 121, the second gate electrode 155b, and the repairing conductor 202. Like the gate insulating layer 140, the interlayer insulating layer 160 may be formed of tetra ethyl ortho silicate (TEOS), silicon nitride, or silicon oxide.

The interlayer insulating layer 160 may be the second insulation layer 104 of the repairing portion of FIG. 2.

Openings 65 and 35 respectively exposing the first pixel electrode 710 and the capacitor 80 are formed in the interlayer insulating layer 160. In addition, the interlayer insulating layer 160 may cover the capacitor 80 rather than exposing the same. A source contact hole 166 and a drain contact hole 167 respectively exposing the source areas 1356a and 1356b the drain areas 1357a and 1357b and contact holes 81 and 82 respectively exposing the second gate electrode 155b and the first electrode 710 are formed in the interlayer insulating layer 160 and the gate insulating layer 140.

A data line 171 including a first source electrode 176a, a constant voltage line 172 including a second source electrode 176b, a first drain electrode 177a, and a second drain electrode 177b are formed on the interlayer insulating layer 160.

The data line 171 transmits a data signal and extends in a direction crossing the gate line 121.

The constant voltage line 172 transmits a constant voltage and extends in the same direction of the data line 171, separated from the data line 171.

The first source electrode 176a protrudes toward the first semiconductor 135a from the data line 171, and the second source electrode 176b protrudes toward the second semiconductor 135b from the constant voltage line 172. The first source electrode 176a and the second source electrode 176b are connected with the source areas 1356a and 1356b respectively through the source contact hole 166.

The first drain electrode 177a faces the first source electrode 176a and the second drain electrode 177b faces the second source electrode 176b, and the first drain electrode 177a and the second drain electrode 177b are connected with the drain areas 1357a and 1357b respectively through the drain contact hole 169.

The first drain electrode 177a is extended along the gate line 121, and electrically connected with the second gate electrode 155b through a contact hole 81.

The second drain electrode 177b is electrically connected with the first pixel electrode 711 through a contact hole 82.

The data line 171 includes a short-circuited portion CC extended to the outside of the display area and disposed in the extended portion. A first small data line 404 and a second small data line 406 disposed at lateral ends with respect to the short-circuited portion CC may be the first conductor 204 and the second conductor 206 of the repairing portion of FIG. 1.

The first small data line 404 and the second small data line 406 are connected with the connection member 200 through the contact holes 67 and 69.

A capacitor electrode (not shown) may further be formed on the interlayer insulating layer 160. The additional capacitor electrode is connected in parallel with the first capacitor electrode 138 or the second capacitor electrode 158 by being overlapped with the same so that charge capacity may be increased.

The first electrode 710 of the organic light emitting element 70 and a pixel defining layer 190 are formed on the first source electrode 176a, the second source electrode 176b, the first drain electrode 177a, and the second drain electrode 177b.

The pixel defining layer 190 includes an opening 195 that exposes the first electrode 710. The pixel definition film 190 may be made of resin, such as polyacrylates or polyimides, and a silica-series inorganic substance.

An organic emission layer 720 is formed in the opening 195 of the pixel defining layer 190.

The organic emission layer 720 includes a plurality of layers including one or more of an emission layer, a hole injection layer (HIL), a hole transport layer (HTL), an electron transport layer (ETL), and an electron injection layer (EIL).

If the organic emission layer 720 includes all of them, the hole injection layer (HIL) may be placed on the pixel electrode 710, that is, the anode, and the hole transport layer (HTL), the emission layer, the electron transport layer (ETL), and the electron injection layer (EIL) may be sequentially stacked over the hole injection layer (HIL).

The second electrode 730 is formed on the pixel defining layer 190 and the organic emission layer 720.

The second electrode 730 becomes a cathode of the organic light emitting element 70. Thus, the first electrode 710, organic emission layer 720, and the second electrode 730 form the organic light emitting element 70.

The second electrode 730 is formed of a reflective layer, transparent layer, or a semi-transparent layer.

The reflective layer and semi-transparent layer are formed of at least one of magnesium (Mg), silver (Ag), gold (Au), calcium (Ca), lithium (Li), chromium (Cr), and aluminum (Al) or an alloy thereof. The reflective layer and the semi-transparent layer are determined based on a thickness, and the semi-transparent layer may have a thickness of less than or equal to 200 nm. Light transmittance is increased as the thickness is decreased, but resistance is increased when the thickness is too thin.

The transparent layer is formed of a material such as indium tin oxide (ITO), indium zinc oxide (IZO), zinc oxide (ZnO).

Hereinafter, a method for repairing the OLED display using laser when a short-circuit occurs due to static electricity will be described with reference to FIG. 12.

Figure 12:
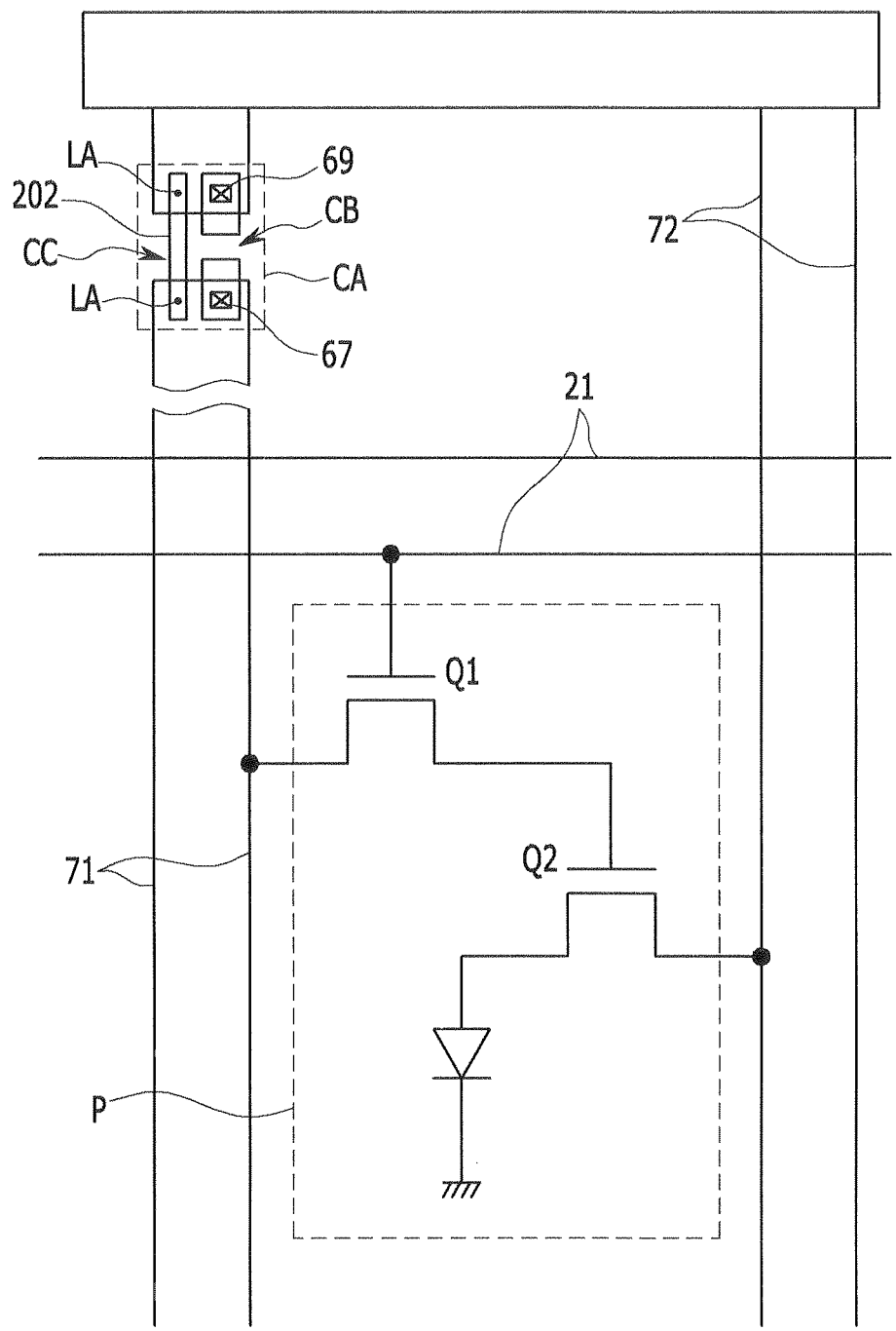
FIG. 12 is a schematic layout view of the OLED display device according to the embodiment of the present invention.

FIG. 12 is a schematic layout view of the OLED display device according to the embodiment.

In reference to FIG. 12, a first signal line 21, a second signal line 72, and a third signal line 72 are formed on a substrate (not shown).

The first signal line 21 and the second signal line 71 are connected with the first thin film transistor Q1, and the first signal line 21 and the third signal line 72 are connected with the second thin film transistor Q2.

The first signal line 21 transmits a gate signal of the OLED display device, the second signal line 71 transmits a data signal, and the third signal line 72 transmits a constant voltage.

The second signal line 71 includes a repairing portion CA. When static electricity flows in the second signal line 71, the connection member 200 is damaged and thus open-circuited. Thus, the signal transmitted from the driver 510 cannot be transmitted to the pixel P through the second signal line 71 so that the pixel becomes a defective pixel.

Thus, laser beam is irradiated to lateral ends of the second signal line 71 overlapping the repairing conductor 202 to short-circuit LA the repairing conductor 202 and the second signal line 71.

When the repairing conductor 202 and the second signal line 71 are short-circuited, the signal transmitted from the driver 510 may be transmitted to the pixel P through the repairing conductor 202.

As in the embodiment, when the connection member and the repairing conductor are formed together, the connection member cannot endure static electricity flowing therein from the outside and thus the connection member is damaged and open-circuited, and accordingly transmission of the static electricity to the pixel may be prevented.

In addition, the second signal line and the repairing conductor are short-circuited using the laser so that the signal may be easily transmitted to the pixel to repair the defective pixel.

While this disclosure has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

<Description of symbols>

| | |
|---|---|
| CA: repairing portion | CB: short-circuit of connection member |
| CC: short-circuit of signal line | LA: short-circuit point due to layer |
| P: pixel | PA: display area |
| PB: extended portion | PC: driver |
| Q1: first thin film transistor | Q2: second thin film transistor |
| 70: organic light emitting element | 80: capacitor |
| 67, 69, 81, 82: contact hole | 21: first signal line |
| 71: second signal line | 72: third signal line |
| 100: substrate | 102: first insulation layer |
| 104: second insulation layer | 120: buffer layer |
| 135a: first semiconductor | 135b: second semiconductor |
| 138: first capacitor electrode | 140: gate insulating layer |
| 155a: first gate electrode | 155b: second gate electrode |
| 158: second capacitor electrode | 160: interlayer insulating layer |
| 190: pixel defining layer | 195: opening |
| 200: connection member | 202: repairing conductor |
| 204: first conductor | 206: second conductor |
| 304: first small signal line | 306: second small signal line |
| 404: first small data line | 406: second small data line |
| 410, 510: drive circuit | 710: first electrode |
| 720: organic emission layer | 730: second electrode |
| 1355a, 1355b: channel area | 1356a, 1356b: source area |
| 1357a, 1357b: drain area | 1551a, 1551b: lower metal layer |
| 1553a, 1553b: upper metal layer | |

The invention claimed is

1. An organic light emitting diode (OLED) display device, comprising:
   a substrate;
   a plurality of first signal lines disposed on the substrate and including first short-circuited portions;
   a plurality of second signal lines crossing the first signal lines in an electrically insulated manner;
   a plurality of thin film transistors, each thin film transistor being connected with a respective first signal line and a respective second signal line;
   an organic light emitting element connected with said each thin film transistor;
   first connection members overlapping lateral ends of the first signal lines, disposed in lateral sides with respect to the first short-circuited portions, and formed of semiconductors doped with a conductive impurity; and
   first repairing conductors overlapping the lateral ends of the first signal lines, disposed in the lateral sides with respect to the first short-circuited portions, wherein lateral ends of the first connection members are connected with the lateral ends of the first signal lines through contact holes.

2. The OLED display device of claim 1, wherein at least one of the first connection members comprises a short-circuited portion.

3. The OLED display device of claim 2, wherein at least one of the first repairing conductors is short-circuited with the lateral ends of a respective one of the first signal lines.

4. The OLED display device of claim 1, wherein each of the second signal lines comprises a second short-circuited portion; and
   wherein the OLED display device further comprises:
   second connection members overlapping lateral ends of the second signal lines, disposed in lateral sides with respect to the second short-circuited portion, and formed of a semiconductor doped with a conductive impurity; and
   second repairing conductors overlapping the lateral ends of the second signal lines, disposed in the lateral sides with respect to the second short-circuited portion;
   lateral ends of the second connection members being connected with the lateral ends of the second signal lines through contact holes.

5. The OLED display device of claim 4, wherein the substrate comprises a display area where the pixels are disposed and a periphery area where a driver for driving the pixels is disposed, and the first short-circuited portion and the second short-circuited portion are disposed in the periphery area.

6. The OLED display device of claim 4, wherein at least one of the second connection members comprises a short-circuited portion.

7. The OLED display device of claim 6, wherein at least one of the second repairing conductors is short-circuited with the lateral ends of the second signal line.

8. The OLED display device of claim 1, wherein the first signal lines are applied with a data signal and the second signal line is lines are applied with a gate signal.

9. The OLED display device of claim 1, further comprised of:
   the substrate including a display area including a plurality of pixels and a periphery area where a driver for driving the pixels is disposed;
   the plurality of first signal lines connected with the pixels and extended to the periphery area, the first signal lines including a first short-circuit portion provided in the periphery area;
   the plurality of second signal lines connected with the pixels and extended to the periphery area by crossing the first signal lines in an electrically insulated manner; and
   comprising short-circuiting the repairing conductor and the first signal line being amenable to short-circuiting by irradiation by a laser beam applied to the lateral ends of the first signal line which overlap lateral ends of the repairing conductor.

* * * * *